(12) United States Patent  (10) Patent No.: US 9,165,860 B2
Kim  (45) Date of Patent: Oct. 20, 2015

(54) MULTI-CHIP SEMICONDUCTOR APPARATUS

(71) Applicant: SK hynix Inc., Icheon-si (KR)

(72) Inventor: Yeon Ok Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 225 days.

(21) Appl. No.: 13/720,497

(22) Filed: Dec. 19, 2012

(65) Prior Publication Data

US 2014/0049280 A1  Feb. 20, 2014

(30) Foreign Application Priority Data

Aug. 20, 2012 (KR) .................. 10-2012-0090719

(51) Int. Cl.
 *H01L 23/48* (2006.01)
 *H01L 21/66* (2006.01)
(52) U.S. Cl.
 CPC .............. *H01L 23/481* (2013.01); *H01L 22/32* (2013.01); *H01L 2224/0401* (2013.01); *H01L 2224/0557* (2013.01); *H01L 2224/06181* (2013.01); *H01L 2224/13099* (2013.01); *H01L 2224/16145* (2013.01); *H01L 2224/16146* (2013.01); *H01L 2924/00014* (2013.01)

(58) Field of Classification Search
 None
 See application file for complete search history.

(56) References Cited

U.S. PATENT DOCUMENTS

| | | | |
|---|---|---|---|
| 6,914,259 B2* | 7/2005 | Sakiyama et al. | 257/48 |
| 2011/0001559 A1* | 1/2011 | Shin et al. | 327/565 |
| 2011/0254000 A1* | 10/2011 | Han | 257/48 |
| 2011/0304349 A1* | 12/2011 | Stillman et al. | 324/756.02 |
| 2012/0187401 A1* | 7/2012 | Waki et al. | 257/48 |
| 2012/0305917 A1* | 12/2012 | Yoko et al. | 257/48 |

FOREIGN PATENT DOCUMENTS

KR  1020110134198 A  12/2011

* cited by examiner

*Primary Examiner* — Paresh Patel
(74) *Attorney, Agent, or Firm* — Kilpatrick Townsend & Stockton LLP

(57) ABSTRACT

A multi-chip semiconductor apparatus includes a plurality of semiconductor chips stacked and packaged therein, wherein each of the semiconductor chips includes: a through-silicon via (TSV) formed through the semiconductor chip; a probe pad exposed to an outside of the semiconductor chip so as to enable a probing test; a bump pad exposed to the outside of the semiconductor chip and electrically connected to the TSV; and a conductive layer electrically connecting the probe pad and the bump pad inside the semiconductor chip.

3 Claims, 3 Drawing Sheets

MULTI-CHIP SEMICONDUCTOR APPARATUS

CROSS-REFERENCES TO RELATED APPLICATION

The present application claims priority under 35 U.S.C. §119(a) to Korean application number 10-2012-0090719 filed on Aug. 20, 2012, in the Korean Intellectual Property Office, the entire disclosure of which is incorporated herein by reference herein.

BACKGROUND

1. Technical Field

Various embodiments presented herein relate to a semiconductor apparatuses, and more particularly, to a multi-chip semiconductor apparatuses including a plurality of semiconductor chips stacked through through-silicon vias (TSVs).

2. Related Art

Packaging technology for semiconductor apparatuses has continuously developed to satisfy demands for miniaturization and reliability of mountings. For example, the demand for miniaturization has accelerated the technology development for packages which are close to chip size. The demand for more reliable mountings has driven the importance and development of packaging technologies capable of improving the efficiency of mounting operations and the mechanical/electrical reliability after mounting.

Furthermore, as high performance electric and electronic products are required with miniaturization, various technologies for providing a high-capacity semiconductor module have been researched and developed. As a method for providing a high-capacity semiconductor module, high integration for memory chips may be used. This high integration may be realized by integrating a larger number of cells into a limited space of a semiconductor chip. However, such high integration for memory chips requires a high-level technology and a large amount of development time. For example, a fine critical dimension (CD) may be required. Therefore, improved stack technology may provide benefits in a high integration environment.

SUMMARY

In one embodiment, a multi-chip semiconductor apparatus includes a plurality of semiconductor chips stacked and packaged therein, wherein each of the semiconductor chips includes: a through-silicon via (TSV) formed through the semiconductor chip; a probe pad exposed to an outside of the semiconductor chip so as to perform a probing test; a bump pad exposed to the outside of the semiconductor chip and electrically connected to the TSV; and a conductive layer electrically connecting the probe pad and the bump pad inside the semiconductor chip.

In another embodiment, a multi-chip semiconductor apparatus includes a plurality of semiconductor chips stacked and packaged therein, wherein each of the semiconductor chips includes: a plurality of TSVs formed through the semiconductor chip; a probe pad exposed to an outside of the semiconductor chip so as to perform a probing test; a plurality of bump pads exposed to the outside of the semiconductor chip and electrically connected to the respective TSVs; and one or more conductive layers electrically connecting the probe pad to the respective bump pads inside the semiconductor chip.

In another embodiment, a multi-chip semiconductor chip includes a plurality of semiconductor chips stacked and packaged therein, wherein each of the semiconductor chip includes: a TSV formed through the semiconductor chip; a bump pad exposed to an outside of the semiconductor chip and electrically connected to the TSV through a first conductive path; an internal circuit formed in the semiconductor chip and electrically connected to the TSV through a second conductive path; and a probe pad exposed to the outside of the semiconductor chip to perform a probing test and electrically connected to the internal circuit through a third conductive path, each of the first to third conductive paths includes a plurality of conductive layers and a plurality of conductive contacts connected between the respective conductive layers, and specific conductive layers of the first and third conductive paths are electrically connected to each other.

In another embodiment, a multi-chip semiconductor chip apparatus includes a plurality of semiconductor chips which are electrically connected and stacked through a TSV, wherein each of the semiconductor chips includes: a memory cell block; a bump pad electrically connected to the TSV and configured to transmit and receive information to and from the memory cell block; and a probe pad configured to transmit and receive test information to and from the memory cell block, and during a probe test after packaging, the probe pad of the semiconductor chip is electrically connected to the bump pad, and transmits and receives the test information on the semiconductor chip to and from outside through the probe pad of the uppermost semiconductor chip of the semiconductor chips.

Additional alternative embodiments will be apparent to a person of ordinary skill in the art according to the descriptions provided herein.

BRIEF DESCRIPTION OF THE DRAWINGS

Features, aspects, and embodiments are described in conjunction with the attached drawings, in which.

DETAILED DESCRIPTION

Hereinafter, a multi-chip semiconductor apparatus will be described below with reference to the accompanying drawings through various embodiments.

A stacked multi-chip semiconductor apparatus has a structure in which two or more semiconductor chips are stacked in one package. As a method for stacking a plurality of semiconductor chips in a package, certain structures may use through-silicon vias (TSVs). In packages using TSVs, holes are formed through the semiconductor chips, and filled with a conductive material to form the TSVs. Through the TSVs, upper and lower semiconductor chips are electrically connected.

Figure 1:
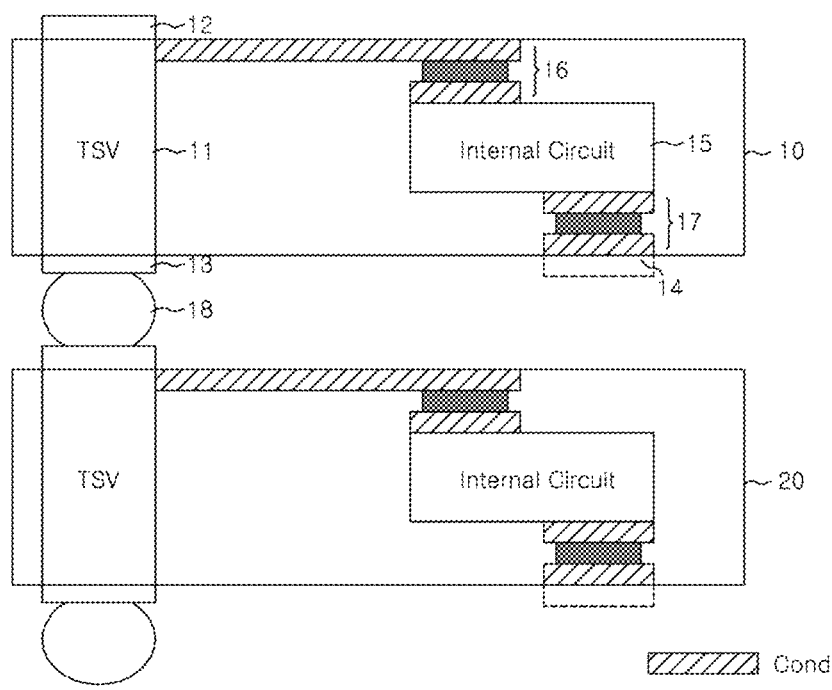
FIG. 1 is a cross-sectional view of a conventional multi-chip semiconductor apparatus including a plurality of semiconductor chips stacked through TSVs.

FIG. 1 is a cross-sectional view of a conventional multi-chip semiconductor apparatus including a plurality of semiconductor chips stacked through TSVs.

The multi-chip semiconductor 1 illustrated in FIG. 1 includes a plurality of semiconductor chips 10 and 20 stacked over a substrate.

Each of the semiconductor chips 10 and 20 includes a TSV formed by filling a hole formed therein. For example, the first semiconductor chip 10 includes a TSV 11 and bump pads 12 and 13 which are electrically connected to both ends of the TSV 11 so as to be exposed to the outside. The bump pads of the semiconductor chips 10 and 20 facing each other may be connected through a bump 18 such that the TSVs of the respective semiconductor chips 10 and 20 are electrically connected to each other.

The TSV 11 of the first semiconductor chip 10 is connected to an internal circuit 15 through a conductive path 16. That is, various voltages/signals used in internal circuits of the semiconductor chips 10 and 20 are transmitted to the respective semiconductor chips through the TSVs, and then transmitted to the internal circuits from the TSVs through the conductive paths inside the semiconductor chips.

Furthermore, each of the stacked semiconductor chips 10 and 20 includes a probe pad formed thereon, in order to perform a probing test on the semiconductor chip before the semiconductor chip is stacked and packaged. The probe pad may include various types of pads to perform various tests by transmitting and receiving a power supply voltage, various signals, data and the like. For example, the probe pad 14 of the first semiconductor chip 10 is electrically connected to the internal circuit 15 through the conductive path 17.

Each of the conductive path 16 to connect the TSV 11 and the internal circuit 15 and the conductive path 17 to connect the probe pad 14 to the internal circuit 15 may include a plurality of conductive layers and a plurality of conductive contacts connected between the respective conductive layers. The probe pad 14 may be formed by opening the uppermost conductive layer among the plurality of conductive layers. The conductive layer may include a metal layer, and the conductive contact may include a metal contact.

Meanwhile, the probing test for the multi-chip semiconductor apparatus 1 could be performed only in a state of mono chips before the respective chips are stacked and packaged. That is because, since the probe pads of the respective chips are not connected through the TSVs, it is difficult to access the probe pads of the respective chips from outside after the packaging is completed. Currently, there is a demand for a method capable of performing a probing test even in a multi-chip semiconductor apparatus having a chip stack structure, which is completely packaged.

Figure 2:
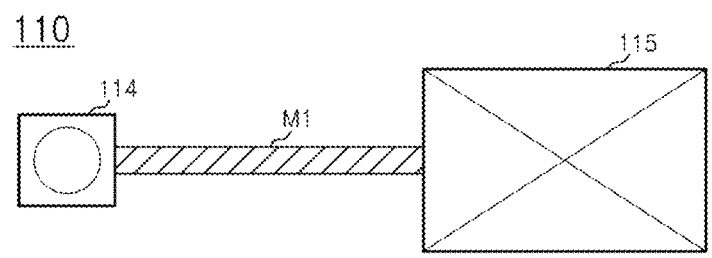
FIG. 2 is a diagram illustrating the structure of a semiconductor chip according to one embodiment.

FIG. 2 is a diagram illustrating the structure of a semiconductor chip 110 according to one embodiment of the present invention. The semiconductor chip 110 illustrated in FIG. 2 includes a bump pad 114 and a probe pad 115 which are exposed to the outside of the semiconductor chip 110 and electrically connected through a specific conductive layer M1 inside the semiconductor chip 110.

More specifically, the semiconductor chip 110 includes a TSV (not illustrated.) The TSV may be formed by filling a hole formed therein. The bump pad 114 which is exposed to the outside of the semiconductor chip 110 is electrically connected to the TSV. The semiconductor chip 110 includes the probe pad 115 exposed to the outside of the semiconductor chip, in order to perform a probing test. The probe pad 115 and the bump pad 114 are electrically connected through the specific layer M1 inside the semiconductor chip 110.

Therefore, the probe pad 115 of the semiconductor chip 110 according to the embodiment illustrated by FIG. 2 may be electrically connected to the bump pad 114 through the conductive layer M1, and electrically connected to the TSV through the bump pad 114.

Figure 3:
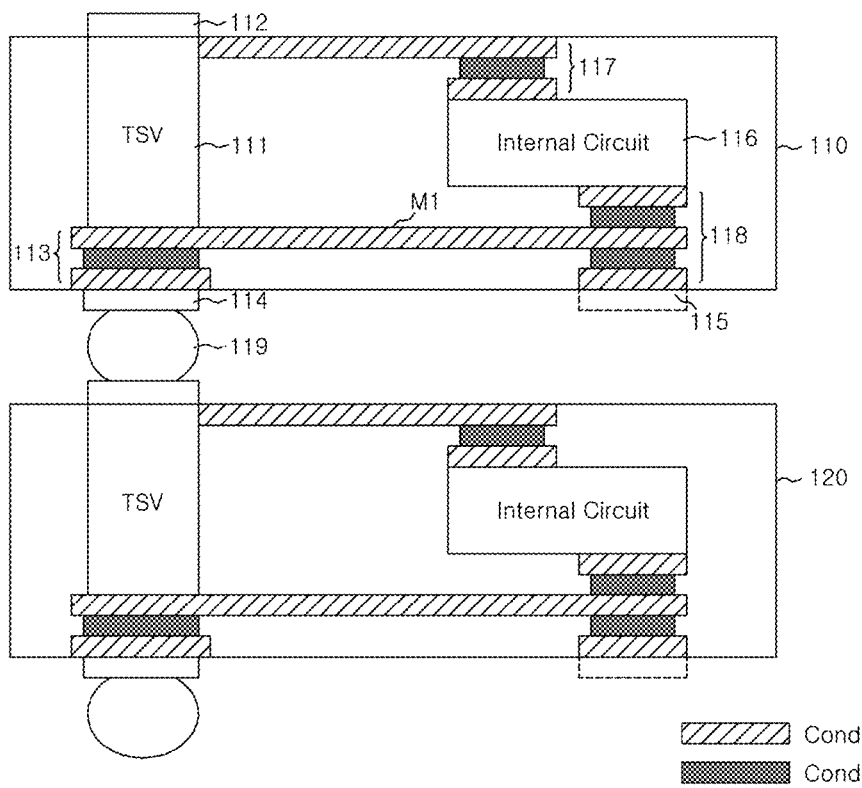
FIG. 3 illustrates one potential embodiment in which a cross-sectional view of a multi-chip semiconductor apparatus in which a plurality of semiconductor chips based on the structure of FIG. 2 are stacked.

FIG. 3 is a cross-sectional view of a multi-chip semiconductor apparatus 100 in which a plurality of semiconductor chips based on the structure of FIG. 2 are stacked.

The multi-chip semiconductor apparatus 100 illustrated in FIG. 3 includes a plurality of semiconductor chips stacked over a substrate. The embodiment of FIG. 3 illustrates the multi-chip semiconductor 100 having first and second semiconductor chips 110 and 120 stacked therein.

The first and second semiconductor chips 110 and 120 each includes a TSV formed by filling a hole formed in the respective chip. In the embodiment illustrated by FIG. 3, the second semiconductor chip 120 has the same configuration as the first semiconductor chip 110. In alternative embodiments, different semiconductor chips may have variations in the configuration of the chips. The following descriptions related to the embodiment of FIG. 2 will be focused on the configuration of the first semiconductor chip 110.

The first semiconductor chip 110 includes a TSV 111, first and second bump pads 112 and 114, a probe pad 115, and an internal circuit 116. The TSV 111 is formed inside the first semiconductor chip 110. The first and second bump pads 112 and 114 exposed to the outside of the semiconductor chip 110 are electrically connected to both ends of the TSV 111. In such an embodiment, the second bump pad 114 formed on the same surface as the probe pad 115 is electrically connected to the TSV 111 through a first conductive path 113. The first conductive path 113 includes a plurality of conductive layers and a plurality of conductive contacts formed between the respective conductive layers. In the embodiment of FIG. 3, the conductive layer and the conductive contact may be formed of a material to pass a current, for example, a metallic material.

Further, in the embodiment of FIG. 3, the internal circuit 116 is connected to the TSV 111 through a second conductive path 117. That is, various voltages and/or signals used in the internal circuit 116 are transmitted to the first semiconductor chip 110 through the TSV 111 from outside semiconductor chip 110, and are then transmitted to the internal circuit 116 from the TSV 111 through the second conductive path 117 inside semiconductor chip 110. The second conductive path 117 may also include a plurality of conductive layers and a plurality of conductive contacts formed between the respective conductive layers.

The probe pad 115 is exposed to the outside of the semiconductor chip so as to perform a probing operation. The probe pad 115 may include various types of pads such as a power supply pad, a signal input/output pad, and a data input/output pad, in order to perform various tests on the semiconductor apparatus. The probe pad 115 is electrically connected through the internal circuit 116 and the third conductive pad 118. The third conductive path 118 also includes a plurality of conductive layers and a plurality of contacts formed between the respective conductive layers. In one potential embodiment, the probe pad 115 may be formed by opening the uppermost conductive layer among the plurality of conductive layers forming the third conductive path 118.

In one potential embodiment, specific conductive layers M1 of the first and third conductive paths 113 and 118 are electrically connected to each other. Through the conductive layers M1, the probe pad 115 is electrically connected to the second bump pad 114, and thus electrically to the TSV 111.

The specific conductive layer M1 may be formed at any one layer of the plurality of conductive layers of the first and third conductive paths 113 and 118, excluding the uppermost conductive layer on which the second bump pad 114 and the probe pad 115 are formed. In this way, the second bump pad 114 and the probe pad 115 may be electrically connected without having an effect on signal interconnections and power interconnections which are arranged around the pads.

Then, as the bump pads of the first and second semiconductor chips 110 and 120 facing each other are connected through a bump 119, the TSVs of the respective semiconductor chips 110 and 120 may be electrically connected to each other.

That is, in the multi-chip semiconductor apparatus according to the embodiment of the present invention, the probe pads formed on the respective semiconductor chips are electrically connected to the TSVs. Accordingly, although packaging is completed after the semiconductor chips are stacked, a probing test for the entire stack of semiconductor chips may be performed by probing the probe pads exposed to the outside of the stack.

Figure 4:
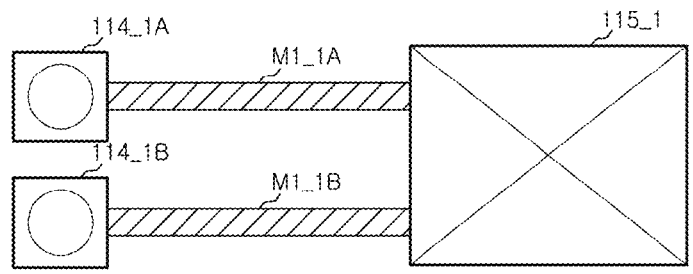
FIG. 4 is a diagram illustrating the structure of a semiconductor chip according to another embodiment.

FIG. 4 is a diagram illustrating the structure of a semiconductor chip 110_1 according to another embodiment.

The semiconductor chip 110_1 illustrated in FIG. 4 includes a plurality of bump pads 114_1A and 114_1B and a probe pad 115_1 which are exposed to the outside of the semiconductor chip and electrically connected through specific conductive layers M1_1A and M1_1B, respectively, inside the semiconductor chip 110_1. The conductive layers M1_1A and M1_1B connecting the probe pad 115_1 to the respective bump pads 114_1A and 114_1B may be formed at the same layer, or at different layers. FIG. 4 illustrates the first bump pad 114_1A and the second bump pad 114_1B, but the present invention is not limited thereto, and alternative embodiments may include alternative bump pad arrangements. The semiconductor chip 110_1 according to an alternative embodiment of the present invention may include a structure in which one probe pad such as probe pad 115_1 is connected to a plurality of bump pads.

More specifically, the semiconductor chip 110_1 includes a plurality of TSVs (not illustrated) formed by filling holes formed therein. The first and second bump pads 114_1A and 114_1B exposed to the outside of the semiconductor chip 100_1 are electrically connected to corresponding TSVs among the plurality of TSVs. The semiconductor chip 110_1 includes the probe pad 115_1 exposed to the outside to perform a probing test, and the probe pad 115_1 is electrically connected to the first and second bump pads 114_1A and 114_1B through the specific conductive layers M1_1A and M1_1B, respectively, inside the semiconductor chip 100_1.

In certain embodiments, multi-chip semiconductor apparatus in which a plurality of semiconductor chips based on the structure of FIG. 4 are stacked has the same structure as illustrated in FIG. 3, except that one probe pad is electrically connected to a plurality of bump pads.

In such embodiments, the multi-chip semiconductor apparatus in which a plurality of semiconductor chips based on the structure of FIG. 4 are stacked includes a plurality of bump pads connected to the probe pad, thereby preparing for various defects which may occur during process and strengthening the connection between the semiconductor chips through the TSVs during a probe test.

Figure 5:
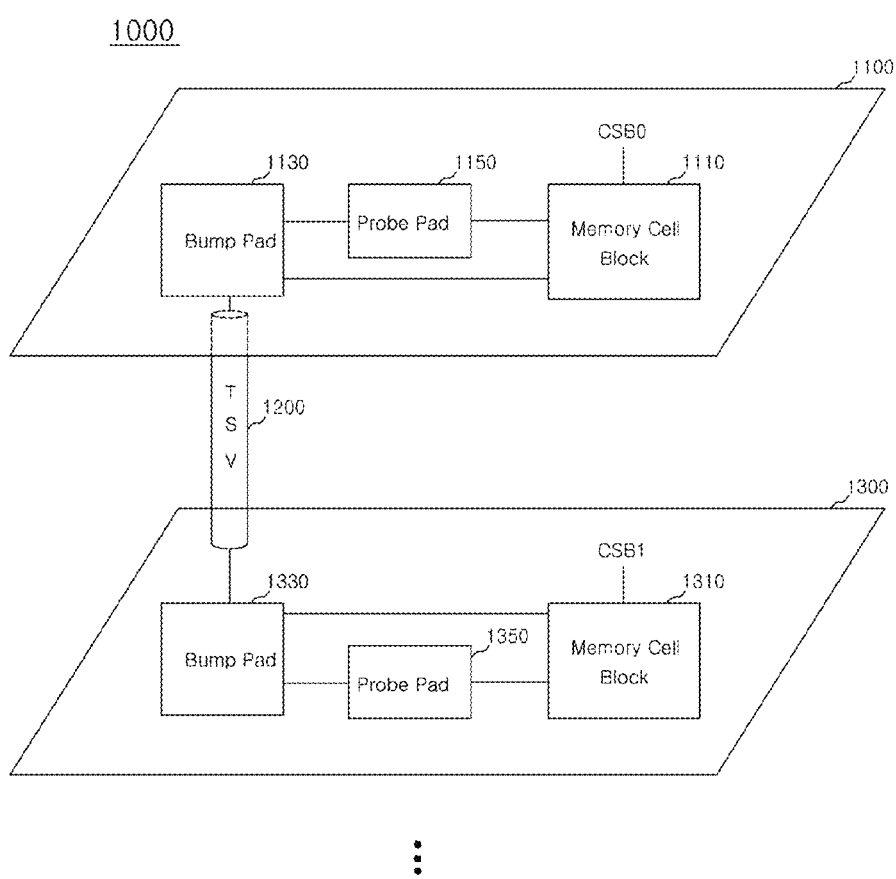
FIG. 5 is a block diagram of a multi-chip semiconductor apparatus according to another embodiment.

FIG. 5 is a block diagram of a multi-chip semiconductor apparatus according to another potential embodiment. The embodiment of a multi-chip semiconductor apparatus 1000 illustrated in FIG. 5 has a structure in which a plurality of semiconductor chips are electrically connected through TSVs. For example, FIG. 5 illustrates first and second semiconductor chips 1100 and 1200 and a TSV 1200 connecting the first and second semiconductor chips 1100 and 1200. However, the present invention is not limited thereto, and in additional alternative embodiments, a larger number of semiconductor chips may be electrically connected and stacked through TSVs. In this embodiment illustrated by FIG. 5, the first semiconductor chip 1100 corresponds to the uppermost semiconductor chip which is electrically connected to an external substrate.

The first semiconductor chip 1100 includes a memory cell block 1110, a bump pad 1130, and a probe pad 1150. The memory cell block 1110 is enabled when a chip select signal CSB0 corresponding to the first semiconductor chip is activated. The first semiconductor chip 1100 is enabled in response to the first chip select signal CSB0. The memory cell block 1110 is configured to input/output data information according to a command applied during a normal operation. The memory cell block 1110 is also configured to input/output test information according to a command applied during a probe test operation.

The bump pad 1130 is electrically connected to the TSV 1200 and serves to transmit and receive signals of the semiconductor chip 1100 to and from outside the semiconductor chip 1100. That is, when the first chip select signal CSB0 is activated, the bump pad 1130 receives information from outside semiconductor chip 1100 and applies the received information to the memory cell block 1110, or receives information from the memory cell block 1110 and outputs the received information to an output of semiconductor chip 1100.

The probe pad 1150 serves to transmit and output signals of the semiconductor chip to and from outside of semiconductor chip 1100 during a probe test. That is, when the first chip select signal CSB0 is activated during the probe test mode, the probe pad 1150 receives test information from outside semiconductor chip 1100 and applies the received test information to the memory cell block 1110, or receives information from the memory cell block 1110 and outputs the received information to outside of semiconductor chip 1100.

The second semiconductor chip 1300 also includes a memory cell block 1310, a bump pad 1330, and a probe pad 1350.

The memory cell block 1310 is enabled when a chip select signal CSB1 corresponding to the second semiconductor chip is activated, like the first semiconductor chip 1100. The second semiconductor chip 1300 is enabled in response to the second chip select signal 1300. The memory cell block 1310 inputs/outputs data information according to a command applied during a normal operation, and input/outputs test information according to a command applied during a probe test operation.

The bump pad 1330 is electrically connected to the TSV 1200, and serves to transmit and receive signals of the semiconductor chip to and from outside semiconductor chip 1300. In one potential embodiment, the bump pad 1330 of the second semiconductor chip 1300 is electrically connected to the bump pad 1130 of the first semiconductor chip 1100 positioned over the second semiconductor chip 1300 through the TSV 1200, and transmits and receives signals to and from outside through the bump pad 1130 of the first semiconductor chip 1100. That is, when the second chip select signal CSB1 is activated, the bump pad 1330 receives information from outside and applies the received information to the memory cell block 1310, or receives information from the memory cell block 1310 and outputs the received information to outside.

The probe pad 1350 may serve to transmit and receive signals of the semiconductor chip to and from outside during a probe test. In a state where a plurality of semiconductor chips are packaged, it may be difficult to perform a test by directly probing a probe pad, except for the uppermost semiconductor chip which exposes a probe pad. According to various embodiments, however, the probe pad 1350 is electrically connected to the bump pad 1300. Therefore, a probe test for the second semiconductor chip 1300 positioned inside may be performed through the TSV 1200. That is, by probing the probe pad 1150 of the first semiconductor chip 1100 positioned at the uppermost part, it is possible to perform a probe test on another semiconductor chip positioned inside, for example, the second semiconductor chip 1300. Specifically, when the second chip select signal CSB1 is activated during a probe test mode, test information is transmitted to or received from the probe pad 1350. Then, the test information is transmitted to or received from outside the chip through the probe pad 1150 of the first semiconductor chip 1100 positioned at the uppermost part through the TSV 1200.

While certain embodiments have been described above, it will be understood to those skilled in the art that the embodiments described are by way of example only. Accordingly, the multi-chip semiconductor apparatus described herein should not be limited based on the described embodiments. Rather, the multi-chip semiconductor apparatus described herein should only be limited in light of the claims that follow when taken in conjunction with the above description and accompanying drawings.

What is claimed is:

1. A multi-chip semiconductor chip comprising a plurality of semiconductor chips stacked and packaged therein,
    wherein each of the semiconductor chips comprises:
    a through-silicon via (TSV) formed through the semiconductor chip;
    a first bump pad exposed to an outside of the semiconductor chip and electrically connected to the TSV through a first conductive path, the first bump being located along a first surface of the semiconductor chip;
    a second bump pad exposed to an outside of the semiconductor chip, the second bump being located along a second surface of the semiconductor chip opposite the first surface;
    an internal circuit formed in the semiconductor chip; and
    a probe pad exposed to the outside of the semiconductor chip, the probe pad being located along the first surface of the semiconductor chip, wherein the probe pad is accessible by a probing test and electrically connected to the internal circuit through a third conductive path,
    wherein the first conductive path is formed between a first end of the TSV and the first bump pad, a second conductive path is formed between a second end of the TSV and the internal circuit so as to be exposed to the outside of the semiconductor chip, and the third conductive path is formed between the probe pad and the internal circuit.

2. The multi-chip semiconductor apparatus according to claim 1, wherein the TSV of the semiconductor chip is electrically connected to a TSV of another underlying semiconductor chip through the bump pad.

3. The multi-chip semiconductor apparatus according to claim 2, further comprising:
    conductive layers formed in the semiconductor chip and electrically connecting the first conductive path and the third conductive path,
    wherein the conductive layers are formed at any one of a plurality of conductive layers excluding the uppermost conductive layer where the bump pad and the probe pad are formed.

* * * * *